US010978654B2

(12) United States Patent
Forrest et al.

(10) Patent No.: US 10,978,654 B2
(45) Date of Patent: Apr. 13, 2021

(54) EXCITON MANAGEMENT IN ORGANIC PHOTOVOLTAIC MULTI-DONOR ENERGY CASCADES

(71) Applicant: The Regents of the University of Michigan, Ann Arbor, MI (US)

(72) Inventors: Stephen R. Forrest, Ann Arbor, MI (US); Olga L Griffith, Saline, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 75 days.

(21) Appl. No.: 15/030,160

(22) PCT Filed: Oct. 27, 2014

(86) PCT No.: PCT/US2014/062350
§ 371 (c)(1),
(2) Date: Apr. 18, 2016

(87) PCT Pub. No.: WO2015/061771
PCT Pub. Date: Apr. 30, 2015

(65) Prior Publication Data
US 2016/0254471 A1 Sep. 1, 2016

Related U.S. Application Data

(60) Provisional application No. 61/895,843, filed on Oct. 25, 2013.

(51) Int. Cl.
H01L 51/42 (2006.01)
H01L 51/00 (2006.01)
H01L 51/50 (2006.01)

(52) U.S. Cl.
CPC ...... *H01L 51/4246* (2013.01); *H01L 51/0002* (2013.01); *H01L 51/424* (2013.01);
(Continued)

(58) Field of Classification Search
None
See application file for complete search history.

(56) References Cited

U.S. PATENT DOCUMENTS 7,947,897 B2* 5/2011 Rand ............... B82Y 10/00
136/263
2009/0229668 A1* 9/2009 Kim ............... B82Y 10/00
136/263
(Continued)

FOREIGN PATENT DOCUMENTS

JP 2013041983 2/2013
TW 201327957 7/2013

OTHER PUBLICATIONS

Merriam-Webster (https://www.merriam-webster.com/dictionary/room%20temperature accessed Sep. 21, 2018) (Year: 2018).*
(Continued)

Primary Examiner — Magali P Slawski
(74) Attorney, Agent, or Firm — Finnegan, Henderson, Farabow, Garrett & Dunner, LLP

(57) ABSTRACT

Disclosed herein are organic photosensitive optoelectronic devices, such as organic photovoltaics, including a photoactive region, wherein the photoactive region contains an energy-cascading multilayer donor region. The energy-cascading multilayer donor region may drive exciton transfer from an anode to a dissociating interface while reducing exciton quenching, improving overlap with the solar spectrum, and minimizing polaron pair recombination, resulting in improved device performance.

16 Claims, 6 Drawing Sheets

(52) U.S. Cl.
CPC ...... *H01L 51/5004* (2013.01); *H01L 51/0037* (2013.01); *H01L 51/0046* (2013.01); *H01L 51/0047* (2013.01); *H01L 51/0054* (2013.01); *H01L 51/0056* (2013.01); *H01L 51/0072* (2013.01); *H01L 51/0081* (2013.01); *H01L 51/0091* (2013.01); *H01L 51/0092* (2013.01); *H01L 51/4253* (2013.01); *Y02E 10/549* (2013.01)

(56) References Cited

U.S. PATENT DOCUMENTS

| | | | | |
|---|---|---|---|---|
| 2011/0291080 | A1* | 12/2011 | Schmid | H01L 51/5012 257/40 |
| 2013/0000719 | A1* | 1/2013 | Zhou | B82Y 10/00 136/256 |
| 2013/0056053 | A1* | 3/2013 | Lochtefeld | H01L 31/0687 136/255 |
| 2013/0167906 | A1 | 7/2013 | Lee et al. | |
| 2014/0224329 | A1* | 8/2014 | Congreve | H01L 51/0055 136/263 |
| 2015/0044804 | A1* | 2/2015 | Barr | C08G 61/126 438/46 |
| 2020/0052159 | A1* | 2/2020 | Huang | H01L 33/60 |

OTHER PUBLICATIONS

Wang et al. "Highly efficient organic p-i-n photovoltaic cells based on tetraphenyldibenzoperiflanthene and fullerene C70" Energy Environ. Sci., 2013, 6, 249 (Year: 2012).*

International Search Report & Written Opinion dated Jan. 23, 2015, PCT/US2014/062350.

Schlenker et al., "Cascade Organic Solar Cells," *Chemistry of Materials*, vol. 23, No. 18, pp. 4133-4135, Sep. 2, 2011.

Reusswig et al., "Enhanced external quantum efficiency in an organic photovoltaic cell via singlet fission exciton sensitizer," *Applied Physics Letters*, vol. 101, No. 11, Sep. 10, 2012.

Xiao et al., "A hybrid planar-mixed tetraphenyldibenzoperiflanthene/ $C_{70}$ photovoltaic cell," *Applied Physics Letters*, vol. 102, No. 7, Feb. 18, 2013.

* cited by examiner

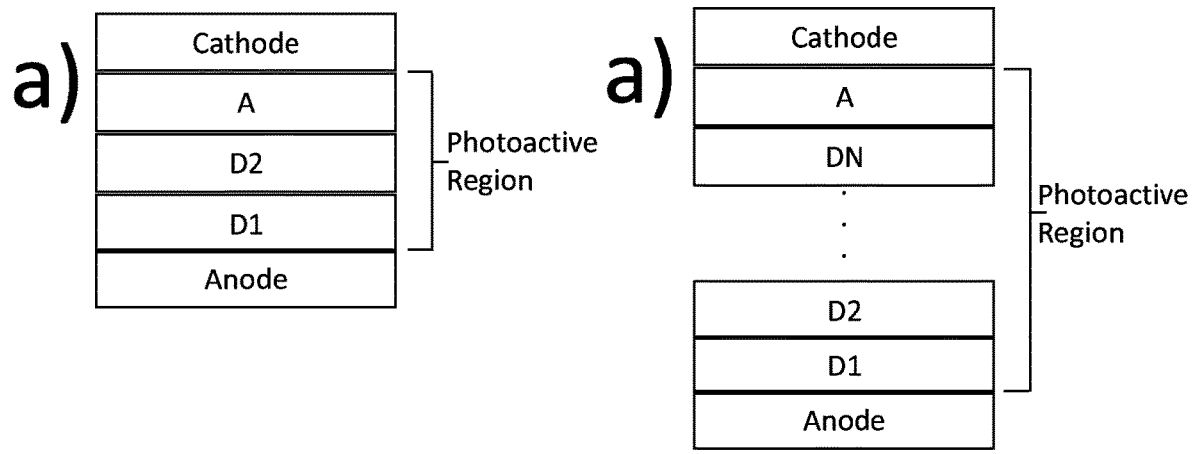
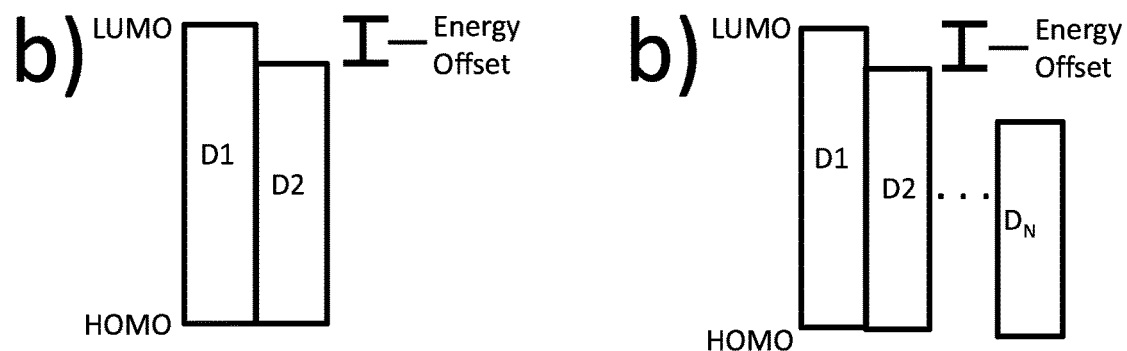
FIG. 1     FIG. 2

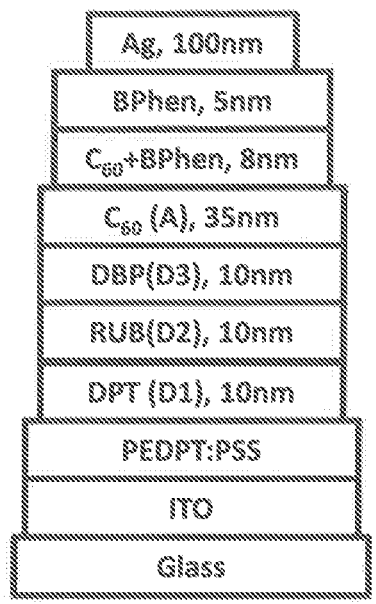
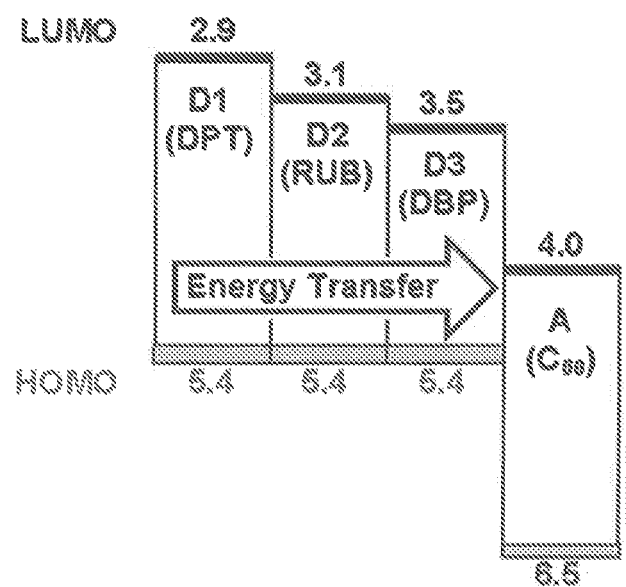
FIG. 5

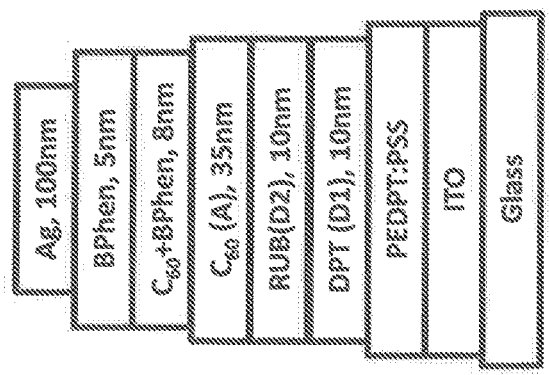 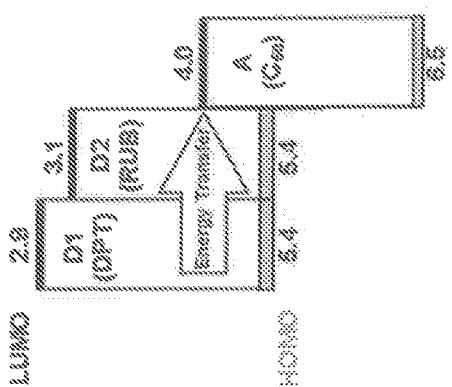
FIG. 6a
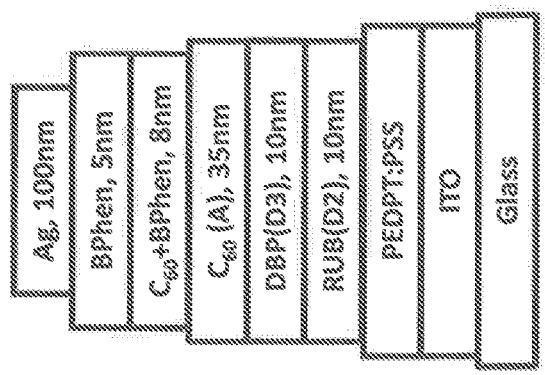 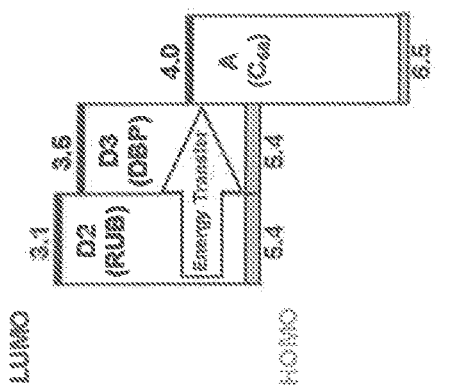
FIG. 6b
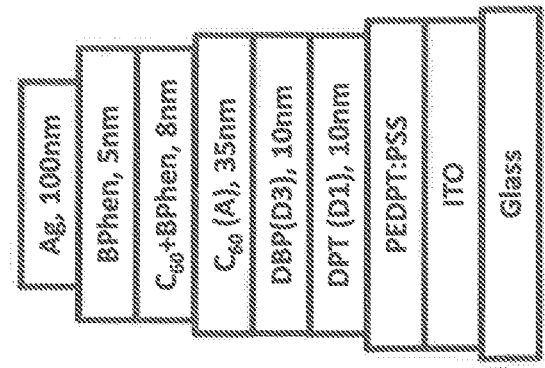 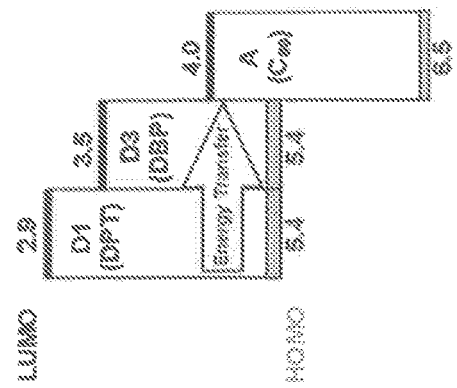
FIG. 6c

EXCITON MANAGEMENT IN ORGANIC PHOTOVOLTAIC MULTI-DONOR ENERGY CASCADES

CROSS-REFERENCE TO RELATED APPLICATION

This application claims the benefit of U.S. Provisional Application No. 61/895,843, filed Oct. 25, 2013, which is incorporated herein by reference in its entirety.

STATEMENT REGARDING FEDERALLY SPONSORED RESEARCH

This invention was made with U.S. Government support under Contract No. DE-SC0000957 awarded by the U.S. Department of Energy. The government has certain rights in the invention.

JOINT RESEARCH AGREEMENT

The subject matter of the present disclosure was made by, on behalf of, and/or in connection with one or more of the following parties to a joint university-corporation research agreement: The Regents of the University of Michigan and NanoFlex Power Corporation. The agreement was in effect on and before the date the subject matter of the present disclosure was prepared, and was made as a result of activities undertaken within the scope of the agreement.

The present disclosure generally relates to electrically active, optically active, solar, and semiconductor devices and, in particular, to organic photosensitive optoelectronic devices comprising multi-donor energy cascades.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications; however, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, FF.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, FF, defined as:

$$FF=\{I_{max}V_{max}\}/\{I_{SC}V_{OC}\} \quad (1)$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = FF^*(I_{SC}^*V_{OC})/P_{inc}$$

To produce internally generated electric fields that occupy a substantial volume of the semiconductor, the usual method is to juxtapose two layers of material (donor and acceptor) with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies, also known as the HOMO-LUMO gap. The Fermi energy characterizes the statistical occupation of molecular quantum energy states denoted by the value of energy for which the probability of occupation is equal to ½. A Fermi energy near the conduction band minimum (LUMO) energy indicates that electrons are the predominant carrier. A Fermi energy near the valence band maximum (HOMO) energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. In some cases, an acceptor material may be an ETL and a donor material may be an HTL.

Conventional inorganic semiconductor PV cells may employ a p-n junction to establish an internal field. However, it is now recognized that in addition to the establishment of a p-n type junction, the energy level offset of the heterojunction also plays an important role.

The energy level offset at an organic donor-acceptor (D-A) heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Carrier generation requires exciton generation, diffusion, and ionization or collection. There is an efficiency $\eta$ associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A^* \eta_{ED}^* \eta_{CC}$$

$$\eta_{EXT} = \eta_A^* \eta_{INT}$$

The diffusion length ($L_D$) of an exciton is typically much less ($L_D \sim 50$ Å) than the optical absorption length (~500 Å), requiring a tradeoff between using a thick, and therefore resistive, cell with multiple or highly folded interfaces, or a thin cell with a low optical absorption efficiency.

OPV cells have the potential for low cost and efficient harvesting of solar energy due to their light weight, flexibility when deposited onto thin substrates, and low energy fabrication processes.

A particularly promising architecture for OPVs is a multi-donor energy cascade that that drives energy and/or charge transfer across a stack of multiple layers whose exciton energies monotonically decrease from the donor nearest to the anode, to the donor nearest to the donor-acceptor heterojunction. Particularly for power generation applications, such as in solar cells, a donor cascade structure may ensure a high open-circuit voltage ($V_{OC}$) and permit increased power conversion efficiency. To realize the full potential of the cascade architecture, the present inventors have identified novel criteria for designing this architecture to, for example, minimize polaron pair recombination—resulting in high $V_{OC}$—and minimize losses within and between each donor layer.

Thus, disclosed herein are novel organic photosensitive optoelectronic devices comprising a photoactive region, wherein the photoactive region comprises an energy-cascading multilayer donor region. The energy-cascading multilayer donor region may drive exciton transfer from an anode to a dissociating interface while reducing exciton quenching, improving overlap with the solar spectrum, and minimizing polaron pair recombination, resulting in improved device performance.

In one aspect, the present disclosure includes an organic photosensitive optoelectronic device comprising two electrodes in superposed relation and an organic photoactive region between the two electrodes, wherein the organic photoactive region comprises a first donor layer adjacent to a second donor layer, and an acceptor region adjacent to the second donor layer, wherein the first and second donor layers are chosen to satisfy the following criteria:
 the first donor layer has a larger optical energy gap than the second donor layer, and
 the first and second donor layers have substantially matching highest occupied molecular orbital (HOMO) energies.

In another aspect, the present disclosure includes an organic photosensitive optoelectronic device comprising:
 two electrodes in superposed relation;
 an organic photoactive region between the two electrodes, wherein the organic photoactive region comprises a donor region interfacing with an acceptor region, the donor region comprising at least three donor layers, wherein the at least three donor layers comprise a first donor layer positioned furthest from the acceptor region, and a last donor layer positioned nearest to the acceptor region, and wherein the at least three donor layers are chosen to satisfy the following criteria:
 each of the at least three donor layers has an optical energy gap such that the optical energy gaps monotonically decrease from the optical energy gap of the first donor layer to the optical energy gap of the last donor layer, and
 the at least three donor layers have substantially matching highest occupied molecular orbital (HOMO) energies.

The accompanying figures are incorporated in, and constitute a part of this specification.

FIGS. 1*a-b* show a schematic of an exemplary device according to the present disclosure.

FIG. 2*a-b* show a schematic of an exemplary device according to the present disclosure FIG. 3*a-b* show schematics of exemplary devices according to the present disclosure FIGS. 4*a-b* show schematics of exemplary devices according to the present disclosure.

FIG. 5 shows a schematic of an exemplary device having a three-donor layer cascade, including particular exemplary materials.

FIGS. 6*a-c* show schematics of exemplary devices having two-donor layer cascades, including particular exemplary materials.

FIG. 7*a* shows current density vs. voltage (J-V) characteristics and FIG. 7*b* shows external quantum efficiency (EQE) under simulated AM1.5G illumination as a function of wavelength of exemplary devices according to the present disclosure.

Figures 3, 4:
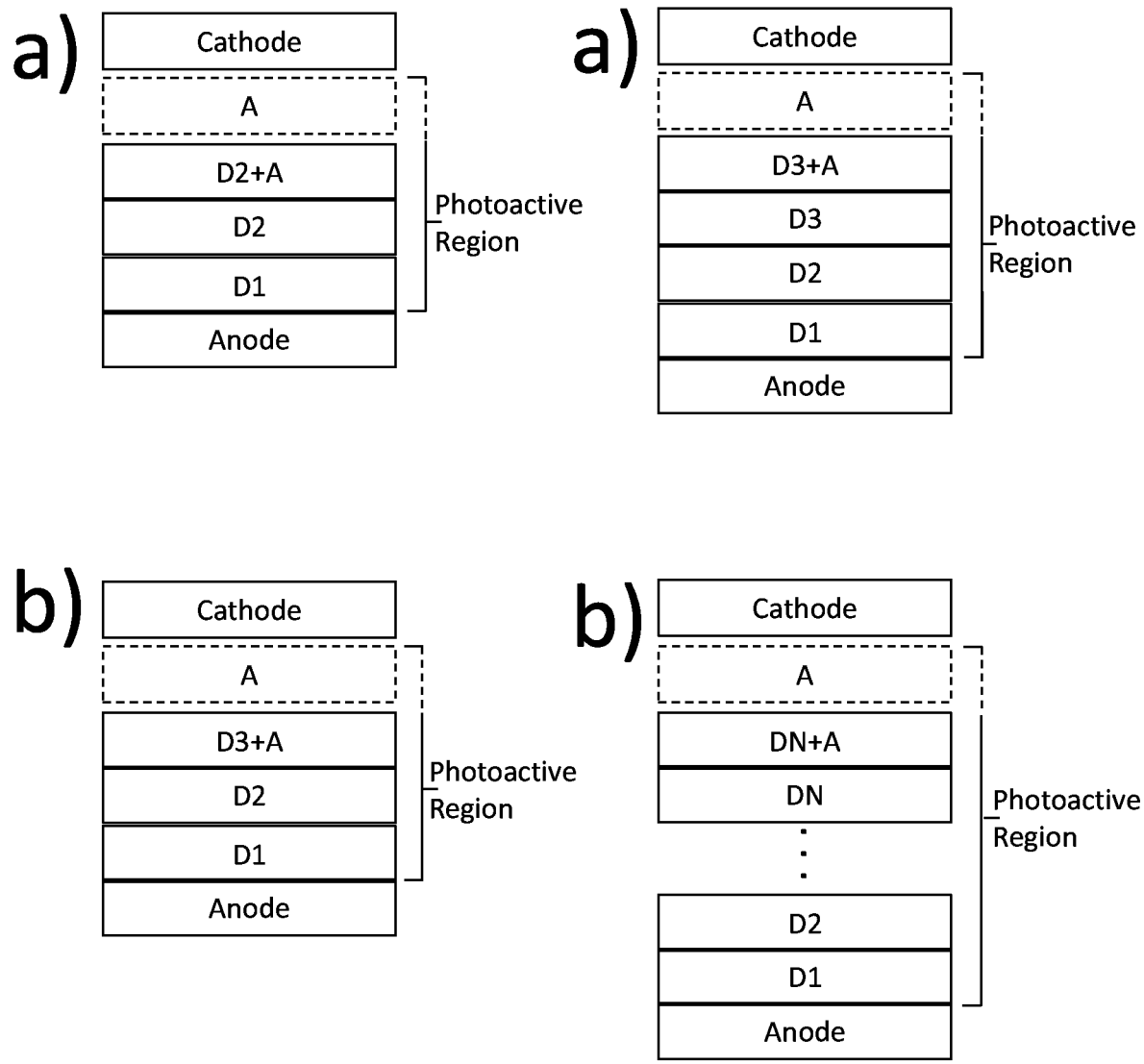

As used herein, the term "organic" includes polymeric materials as well as small molecule organic materials that may be used to fabricate organic photosensitive devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone.

The terms "electrode" and "contact" used herein may refer to a layer that provides a medium for delivering photo-generated current to an external circuit or providing a bias current or voltage to the device. That is, an electrode, or contact, may provide the interface between the photoactive region of an organic photosensitive optoelectronic device and a wire, lead, trace or other means for transporting the charge carriers to or from the external circuit. Anodes and cathodes are examples. U.S. Pat. No. 6,352,777, incorporated herein by reference for its disclosure of electrodes, provides examples of electrodes, or contacts, which may be used in a photosensitive optoelectronic device. At least one "electrode" as described herein may refer to a charge transfer region or recombination zone, such as those used in tandem photovoltaic devices to separate the subcells of the device.

In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent. An electrode is said to be "transparent" when it permits at least 50% of the ambient electromagnetic radiation in relevant wavelengths to be transmitted through it. An electrode is said to be "semi-transparent" when it permits some, but less than 50% transmission of ambient electromagnetic radiation in relevant wavelengths. The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, a "photoactive region" refers to a region of the device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used herein, "acceptor region" refers to a layer or layers of a photoactive region comprising at least one acceptor material.

One of the electrodes of the present disclosure may be an anode, and the other electrode a cathode. It should be understood that the electrodes should be optimized to receive and transport the desired carrier (holes or electrons). The term "cathode" is used herein such that in a non-stacked PV device or a single unit of a stacked PV device under ambient irradiation and connected with a resistive load and with no externally applied voltage, e.g., a solar cell, electrons move to the cathode from the photoactive region. Similarly, the term "anode" is used herein such that in a PV device under illumination, holes move to the anode from the photoactive region, which is equivalent to electrons moving in the opposite manner. It is noted that the "anode" and "cathode" electrodes may be charge transfer regions or recombination zones, such as those used in tandem photovoltaic devices to separate the subcells of the device.

As used herein, the "optical energy gap" of a layer refers to the energy required to excite a molecule optically from ground to its first excited state. In other words, the optical energy gap is the energy difference between the ground and first optically excited state of a molecule.

As described herein, HOMO energy levels of donor layers are "substantially matching" if the donor layers comprise organic materials having HOMO energy levels within 0.1 eV of one another.

HOMO and LUMO energy levels of a layer as described herein refer to HOMO and LUMO energy levels of a material forming the layer.

As described above, in one aspect, the present disclosure includes an organic photosensitive optoelectronic device comprising two electrodes in superposed relation and an organic photoactive region between the two electrodes, wherein the organic photoactive region comprises a first donor layer adjacent to a second donor layer, and an acceptor region adjacent to the second donor layer.

A non-limiting example of an organic photosensitive optoelectronic device according to the present disclosure is shown in FIG. 1a. The device comprises a photoactive region disposed between an anode and a cathode, wherein the photoactive region comprises a first donor layer (D1), a second donor layer (D2), and an acceptor region comprising an acceptor material (A).

According to the design criteria of the present disclosure, the first donor layer (D1) and the second donor layer (D2) are chosen to satisfy the following criteria:
  the first donor layer has a larger optical energy gap than the second donor layer, and
  the first and second donor layers have substantially matching highest occupied molecular orbital (HOMO) energies.

In some embodiments, the criteria further requires that an energy offset between lowest unoccupied molecular orbital energies (LUMO) energy levels of the first donor layer to the second donor layer, as shown, e.g., in FIG. 1b, is small enough to substantially prevent exciton dissociation at the interface between the first and second donor layers. In certain embodiments, the energy offset is less than or equal to 0.5 eV, such as, for example, less than or equal to 0.4 eV, 0.3 eV, 0.2 eV, or 0.1 eV.

Examples of suitable donor materials include but are not limited to diphenyltetracene (DPT), rubrene (RUB), phthalocyanines, such as copper phthalocyanine (CuPc), chloro-aluminium phthalocyanine (ClAlPc), tin phthalocyanine (SnPc), zinc phthalocyanine (ZnPc), and other modified phthalocyanines, subphthalocyanines, such as boron subphthalocyanine (SubPc), naphthalocyanines, merocyanine dyes, boron-dipyrromethene (BODIPY) dyes, thiophenes, such as poly(3-hexylthiophene) (P3HT), low band-gap polymers, polyacenes, such as pentacene and tetracene, diindenoperylene (DIP), squaraine (SQ) dyes, and tetraphenyldibenzoperiflanthene (DBP), with the understanding that the donor materials are chosen to satisfy the donor layer criteria of the present disclosure. Other organic donor materials are contemplated.

In some embodiments, one of the donor layers comprises DBP. In certain embodiments, the second donor layer comprises DBP.

In some embodiments, one of the donor layers comprises rubrene (RUB). In certain embodiments, the first donor layer comprises RUB. In certain embodiments, the second donor layer comprises RUB. In certain embodiments, the first donor layer comprises RUB and the second donor layer comprises DBP.

In some embodiments, one of the donor layers comprises diphenyltetracene (DPT). In certain embodiments, the first donor layer comprises DPT. In certain embodiments, the first donor layer comprises DPT and the second donor layer is chosen from RUB and DBP.

Examples of suitable acceptor materials include but are not limited to polymeric or non-polymeric perylenes, polymeric or non-polymeric naphthalenes, and polymeric or non-polymeric fullerenes and fullerene derivatives (e.g., PCBMs, ICBA, ICMA, etc.). Non-limiting mention is made to those chosen from $C_{60}$, $C_{70}$, $C_{76}$, $C_{82}$, $C_{84}$, or derivatives thereof such as Phenyl-$C_{61}$-Butyric-Acid-Methyl Ester ([60] PCBM), Phenyl-$C_{71}$-Butyric-Acid-Methyl Ester ([70] PCBM), or Thienyl-$C_{61}$-Butyric-Acid-Methyl Ester ([60] ThCBM), and other acceptors such as 3,4,9,10-perylenetetracarboxylic-bisbenzimidazole (PTCBI), hexadecafluorophthalocyanine ($F_{16}$CuPc), and derivatives thereof. Other organic acceptor materials are contemplated by the present disclosure.

In some embodiments, the acceptor region comprises a fullerene or derivative thereof. In certain embodiments, the fullerene is chosen from $C_{60}$ and $C_{70}$.

In some embodiments, the device is a solar cell having a power conversion efficiency of at least 5.5%.

Another non-limiting example of an organic photosensitive optoelectronic device according to the present disclosure is shown in FIG. 2a. The device comprises a photoactive region disposed between an anode and a cathode, wherein the photoactive region comprises a donor region (D1, D2, . . . $D_N$) interfacing with an acceptor region comprising an acceptor material (A). The donor region comprises at least three donor layers (D1, D2, . . . $D_N$), wherein the at least three donor layers comprise a first donor layer (D1) positioned furthest from the acceptor region, and a last donor layer ($D_N$) positioned nearest to the acceptor region.

According to the design criteria of the present disclosure, the at least three donor layers are chosen to satisfy the following criteria:

each of the at least three donor layers has an optical energy gap such that the optical energy gaps monotonically decrease from the optical energy gap of the first donor layer to the optical energy gap of the last donor layer, and the at least three donor layers have substantially matching highest occupied molecular orbital (HOMO) energy levels.

In some embodiments, the criteria further requires that energy offsets between lowest unoccupied molecular orbital energies (LUMO) energies of each pair of adjacent donor layers are small enough to substantially prevent exciton dissociation. In certain embodiments, no two adjacent donor layers have an energy offset between LUMO energy levels greater than 0.5 eV. For example, in certain embodiments, each energy offset between LUMO energies of adjacent donor layers is less than or equal to 0.5 eV, such as, e.g., less than or equal to 0.4 eV, 0.3 eV, 0.2 eV, or 0.1 eV.

Examples of suitable donor and acceptor materials are described above, with the understanding that the materials should be selected to satisfy the design criteria of the present disclosure.

In some embodiments, one of the donor layers is DBP. In some embodiments, one of the donor layers is RUB. In some embodiments, one of the donor layers is DPT. In certain embodiments, the last donor layer is DBP. In certain embodiments, the last donor layer is DBP and the first donor layer is DPT. In certain embodiments, the at least three donor layers comprise DBP, RUB, and DPT, wherein the last donor layer is DBP. In certain embodiments, the at least three donor layers comprise DBP, RUB, and DPT, wherein the last donor layer is DBP and the first donor layer is DPT.

In some embodiments, the acceptor region comprises a fullerene or derivative thereof. In certain embodiments, the fullerene is chosen from $C_{60}$ and $C_{70}$.

The descending order of donor layer optical energy gaps towards the donor-acceptor heterojunction directs the exciton energy transfer from higher to lower singlet exciton states toward the donor-acceptor heterojunction—primarily via Förster energy transfer—where the excitons can dissociate into electrons and holes. The HOMO energy levels of the donor materials substantially match to provide efficient hole transport to the anode. Additionally, by limiting the LUMO energy offsets between pairs of donor layers, exciton dissociation at intermediate donor layer interfaces is minimized to prevent photocurrent generation at those intermediate interfaces. Further, by choosing an acceptor material and a donor material nearest the acceptor region with a large energy offset between the HOMO energy level of the donor and the LUMO energy of the acceptor, open-circuit voltage can be maximized, resulting in improved device performance.

Moreover, in the context of the present criteria, the donor layer nearest the anode can be optimized for exciton blocking, any intermediate donor layers can be optimized for optical absorption, and the donor layer nearest the acceptor region can ensure a high open circuit voltage ($V_{oc}$) due to minimization of the polaron pair recombination rate, as described above.

Thus, multilayer cascades within the context of the present design criteria may offer the flexibility of using several donor materials in a single device, each optimized for a different purpose, resulting in improved device performance, such as increased power conversion efficiency.

In some embodiments, the device is a solar cell having a power conversion efficiency of at least 7%.

The organic photosensitive optoelectronic devices of the present disclosure form a donor-acceptor heterojunction at the interface between the acceptor material and the donor material nearest the acceptor region. In some embodiments, the donor-acceptor heterojunction is chosen from a planar heterojunction and a bulk heterojunction.

In some embodiments of the present disclosure, the photoactive region comprises a mixed photoactive layer comprising a mixture of at least one donor material and at least one acceptor material. In some embodiments, the photoactive layer may comprise a neat donor region and a mixed photoactive layer.

As used herein, "neat" layers refer to layers comprising a single material (i.e. not a mixed layer). Similarly, neat regions refer to regions comprising only neat layers. Henceforth, layers are presumed to be neat unless modified by the word "mixed" (i.e. a mixed layer or a mixed photoactive layer) or otherwise indicated to comprise more than one material.

A non-limiting example of an organic photosensitive optoelectronic device according to the present disclosure is shown in FIG. 3a. The device comprises a photoactive region disposed between an anode and a cathode, wherein the photoactive region comprises a first donor layer comprising a first donor material (D1), a second donor layer comprising a second donor material (D2), and a mixed photoactive layer comprising a mixture of a donor material, such as the second donor material, and an acceptor material (D2+A).

According to the design criteria of the present disclosure, the first donor material (D1) and the second donor material (D2) are chosen to satisfy the following criteria:

the first donor material has a larger optical energy gap than the second donor material, and the first and second donor materials have substantially matching highest occupied molecular orbital (HOMO) energies.

As shown in FIG. 3, the mixed photoactive layer (D2+A) may be disposed between the second layer (D2) and the cathode. In some embodiments, an additional layer comprising an acceptor material may optionally be disposed between the mixed photoactive layer (D2+A) and the cathode. In certain embodiments, the additional layer comprises the acceptor material (A) (i.e., the same acceptor material found in the mixed photoactive layer). Optional acceptor layer (A) is indicated in FIG. 3a by a dashed perimeter.

In some embodiments, the mixed photoactive layer comprises the same donor material as the second donor layer. In other embodiments, the mixed photoactive layer may comprise a third donor material not included in the first donor layer or the second donor layer and an acceptor material (D3+A), as shown in FIG. 3b. The third donor material may be chosen to have an optical energy gap equal to or smaller than that of the second donor layer (D2) and a HOMO energy that substantially matches the HOMO energies of the first (D1) and second (D2) donor layers. An optional acceptor layer (A), such as that described above, may also be disposed between the mixed photoactive layer and the cathode, as indicated in FIG. 3b by a dashed perimeter.

In some embodiments, one of the donor layers is DBP. In some embodiments, one of the donor layers is RUB. In some embodiments, one of the donor layers is DPT. In certain embodiments, the second donor layer is DBP. In certain embodiments, the second donor layer is DBP and the first donor layer is DPT. In certain embodiments, the three donor materials comprise DBP, RUB, and DPT, wherein the mixed photoactive layer comprises DBP. In certain embodiments, the three donor materials comprise DBP, RUB, and DPT, wherein the donor material of the mixed photoactive layer is DBP and the first donor layer is DPT.

Another non-limiting example of an organic photosensitive optoelectronic device according to the present disclosure is shown in FIG. 4a. The device comprises a photoactive region having a neat donor region comprising three donor layers (D1, D2, D3) interfacing with a mixed photoactive layer comprising a donor material and an acceptor material (D3+A). disposed between an anode and a cathode.

According to the design criteria of the present disclosure, the three donor layers are chosen to satisfy the following criteria:

each of the three donor layers has an optical energy gap such that the optical energy gaps monotonically decrease from the optical energy gap of the first donor layer to the optical energy gap of the third donor layer, and the at least three donor layers have substantially matching highest occupied molecular orbital (HOMO) energy levels.

In some embodiments, the mixed photoactive layer may be disposed between the third layer (D3) and a cathode. In some embodiments, an additional layer comprising an acceptor material (A) may optionally be disposed between the mixed photoactive layer (D3+A) and the cathode. In certain embodiments, the additional layer comprises the acceptor material (A) (i.e., the same acceptor material found in the mixed photoactive layer).

In some embodiments, the mixed photoactive region may comprise the same donor material as the third donor layer (D3). This design criteria may be applied to devices having donor layers D1, D2, ... $D_N$, wherein the mixed photoactive layer comprises ($D_N$+A), as shown in FIG. 4. The donor materials forming donor layers D1, D2, ... $D_N$ are chosen such that each of the donor layers has an optical energy gap such that the optical energy gaps monotonically decrease from the optical energy gap of the first donor material (D1) to the optical energy gap of the last donor material ($D_N$), and the donor materials have substantially matching highest occupied molecular orbital (HOMO) energy levels.

In other embodiments, the photoactive region may comprise at least three donor layers (D1, D2, ... $D_N$) and the mixed photoactive layer may comprise a mixture of an additional donor material ($D_{N+1}$) not included in the previous donor layers ($D_{N+1}$). Thus, in this embodiment, $D_N$+A in FIG. 4b becomes $D_{N+1}$+A. The additional donor material may be chosen to have an optical energy gap equal to or smaller than that of the donor material of the previous adjacent donor layer and a HOMO energy that substantially matches the HOMO energies of the previous donor layers. An optional acceptor layer (A) may also be disposed between the mixed photoactive layer and the cathode, as indicated in FIG. 4b by a dashed perimeter. In certain embodiments, the acceptor layer comprises the acceptor material (A) (i.e., the same acceptor material found in the mixed photoactive layer).

In some embodiments, one of the donor layers is DBP. In some embodiments, one of the donor layers is RUB. In some embodiments, one of the donor layers is DPT. In certain embodiments, the last donor layer is DBP. In certain embodiments, the last donor layer is DBP and the first donor layer is DPT. In certain embodiments, the at least three donor layers comprise DBP, RUB, and DPT, wherein the last donor layer is DBP. In certain embodiments, the at least three donor layers comprise DBP, RUB, and DPT, wherein the last donor layer is DBP and the first donor layer is DPT.

In some embodiments, the mixed photoactive layer comprises the same donor material as the last donor layer. In certain embodiments, the mixed photoactive layer comprises DBP. In certain embodiments, the mixed photoactive layer comprises a donor material not included in the neat donor region, wherein the mixed photoactive layer comprises DBP.

In certain embodiments of the present disclosure, the acceptor material in the mixed photoactive layer is a fullerene, such as $C_{60}$ or $C_{70}$, or a derivative thereof.

Exciton dissociation at the donor-acceptor heterojunction may be improved where the donor-acceptor heterojunction is a mixed photoactive layer comprising a donor material and an acceptor material. Improved exciton dissociation may increase $V_{OC}$, thereby leading to an improved power conversion efficiency of the device.

The organic photosensitive optoelectronic devices of the present disclosure may further comprise additional layers as known in the art for such devices. For example, devices may further comprise charge carrier transport layers and/or buffers layers such as one or more blocking layers, such as an exciton blocking layer (EBL). In some embodiments, one or more blocking layers are located between an electrode and the photoactive region. With regard to materials that may be used as an exciton blocking layer, non-limiting mention is made to those chosen from bathocuproine (BCP), bathophenanthroline (BPhen), 1,4,5,8-Naphthalene-tetracarboxylic-dianhydride (NTCDA), 3,4,9,10-perylenetetracarboxylicbis-benzimidazole (PTCBI), 1,3,5-tris(N-phenylbenzimidazol-2-yl)benzene (TPBi), tris (acetylacetonato) ruthenium(III) (Ru(acac)3), and aluminum (III)phenolate (Alq2 OPH), N,N'-diphenyl-N,N'-bis-alpha-naphthylbenzidine (NPD), aluminum tris(8-hydroxyquinoline) (Alq3), and carbazole biphenyl (CBP). Examples of blocking layers are described in U.S. Patent Publication Nos. 2012/0235125 and 2011/0012091 and in U.S. Pat. Nos. 7,230,269 and 6,451,415, which are incorporated herein by reference for their disclosure of blocking layers. In addition, blocking layers may be exciton blocking charge carrier filters, such as those described in PCT Application No. PCT/US2014/033981.

In addition, the devices may further comprise at least one smoothing layer. A smoothing layer may be located, for example, between a photoactive region and either or both of the electrodes. A film comprising 3,4 polyethylenedioxy-thiophene:polystyrenesulfonate (PEDOT:PSS) is an example of a smoothing layer.

The organic photosensitive optoelectronic devices of the present disclosure may exist as a tandem device comprising two or more subcells. A subcell, as used herein, means a component of the device which comprises at least one donor-acceptor heterojunction. When a subcell is used individually as a photosensitive optoelectronic device, it typically includes a complete set of electrodes. For example, the devices shown in FIGS. 1-4 may each constitute a subcell that can be combined with another subcell to form a tandem device. A tandem device may comprise charge transfer material, electrodes, or charge recombination material or a tunnel junction between the subcells. In some tandem configurations, it is possible for adjacent subcells to utilize common, i.e., shared, electrode, charge transfer region or charge recombination zone. In other cases, adjacent subcells do not share common electrodes or charge transfer regions. The subcells may be electrically connected in parallel or in series.

In some embodiments, the charge transfer layer or charge recombination layer may be chosen from Al, Ag, Au, $MoO_3$, Li, LiF, Sn, Ti, WO3, indium tin oxide (ITO), tin oxide (TO), gallium indium tin oxide (GITO), zinc oxide (ZO), or zinc indium tin oxide (ZITO). In another embodiment, the charge transfer layer or charge recombination layer may be comprised of metal nanoclusters, nanoparticles, or nanorods.

The devices of the present disclosure may be, for example, photodetectors, photoconductors, or photovoltaic devices, such as solar cells.

Layers and materials may be deposited using techniques known in the art. For example, the layers and materials described herein can be deposited or co-deposited from a solution, vapor, or a combination of both. In some embodiments, organic materials or organic layers can be deposited or co-deposited via solution processing, such as by one or more techniques chosen from spin-coating, spin-casting, spray coating, dip coating, doctor-blading, inkjet printing, or transfer printing.

In other embodiments, organic materials may be deposited or co-deposited using vacuum evaporation, such as vacuum thermal evaporation, organic vapor phase deposition, or organic vapor-jet printing.

There is also disclosed herein a method of fabricating an organic photosensitive optoelectronic device as described herein, comprising depositing a photoactive region over a first electrode, and depositing a second electrode over the photoactive region, the photoactive region comprising a donor region interfacing with an acceptor region, the donor region comprising two or more donor layers, wherein the two or more donor layers comprise a first donor layer positioned furthest from the acceptor region and a last donor layer positioned nearest the acceptor region, and wherein the two or more donor layers are chosen to satisfy the following criteria:
- each of the two or more donor layers has an optical energy gap such that the optical energy gaps monotonically decrease from the optical energy gap of the first donor layer to the optical energy gap of the last donor layer, and
- the two or more donor layers have substantially matching highest occupied molecular orbital (HOMO) energy levels.

In some embodiments, the photoactive region may include a mixed photoactive layer comprising a donor material and an acceptor material. In certain embodiments, the donor material of the mixed photoactive region may comprise the same material as the last donor layer. In other certain embodiments, the donor material of the mixed photoactive layer may comprise a donor material not included in the first or last donor layers.

The two or more donor layers may be chosen according to the additional criteria and optimizations described herein. For example, in some embodiments, the last donor layer comprises DBP.

It should be understood that embodiments described herein may be used in connection with a wide variety of structures. Functional organic photovoltaic devices may be achieved by combining various layers described in different ways, or certain layers may be omitted entirely, based on design, performance, and cost factors. Additional layers not specifically described may also be included. Materials other than those specifically described may be used. The names given to the various layers herein are not intended to be strictly limiting.

Other than in the examples, or where otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

The devices and methods described herein will be further described by the following non-limiting examples, which are intended to be purely exemplary.

EXAMPLES

Organic photosensitive optoelectronic devices with two- and three-layer donor cascades were fabricated and tested. The three-layer donor cascade consisted of DPT/RUB/DBP. To understand the role played by each donor layer in the cascade, analyses of exciton blocking, quenching, and transfer at each donor-donor interface were performed. To isolate performance contributions of each interface, performances of separate devices using two-layer DPT/RUB and RUB/DBP donor cascades were observed. The performance of a DPT/DBP interface was also studied to further investigate donor performance attributes. Analysis of the results were used to explain the performance results of the DPT/RUB/DBP multilayer donor cascade. The following preparation and measurement procedures were followed for each example.

ITO-coated (15 Ω/sq) glass substrates (from Bayview) were detergent and solvent cleaned, and exposed to ultraviolet light and ozone for 10 minutes prior to depositing PEDOT:PSS films and loading into vacuum thermal evaporation (VTE) chamber (base pressure of $<1 \times 10^{-7}$ Torr). PEDOT:PSS PH 500 aqueous dispersion was purchased from Clevios. The solution of PEDOT:PSS with isopropanol (IPA) was made with 1:2 blend ratio, filtered using 0.45 micron pvm filters. ITO substrates covered with spin-coated PEDOT:PSS films were annealed on a hot plate for 10 minutes at 130° C. in air.

DPT, RUB, DBP, and BPhen were purchased from Lumtec (active layers were of sublimed grade). $C_{60}$ was purchased from MER, sublimed grade. All organic materials with exception of Bphen were further purified by vacuum thermal gradient purification. Ag pellets of 99.9999% purity were purchased from Alfa Aesar.

Solar cell diameter was 1 mm, as defined by the size of the shadow mask openings (circular shaped) for metal depositions. Film thickness were measured using variable-angled spectroscopic ellipsometry.

The deposition rate for RUB was 1.5 Å/s and for all other materials was 1.0 Å/s.

The EQE was measured using a lock-in amplifier and a fibercoupled monochromated Xe arc-discharge lamp (fwhm≈15 nm). The optical power was calibrated using a NIST-traceable Si photodetector and chopped at 200 Hz. Photovoltaic performance was tested with a semiconductor parameter analyzer using simulated air mass 1.5 global (AM1.5G) illumination, where illumination intensity was measured with an NREL-traceable KG-5 filtered Si referenced cell. Performance parameters, such as open-circuit voltage (Voc), short-circuit current (Jsc), fill factor (FF), and power conversion efficiency (PCE) are reported for the best repeatable efficiencies for the given device architecture. Experimental errors for Voc and FF may arise from variations between devices, and the error in Jsc (~5%) is primarily from uncertainty in measuring the intensity and spectrum of the lamp, which also dominates the error in PCE.

Photoluminescence (PL) measurements were made on following structures: quartz (Qz)/active layer 60 nm/capping layer 8 nm, where 1) active layer was DBP and capping layers were RUB, BPhen, $C_{60}$, DPT; and 2) active layer was DPT, and capping layers were RUB, BPhen, $MoO_3$. The photoluminescence emission spectra of these samples were measured using a PTI QuantaMaster sectrofluorometer at an incident angle of 30° in a high purity $N_2$ atmosphere to prevent atmospheric degradation of the films. The samples were illuminated through the active layer (Qz side was the back side; capping layer side was the front side facing the incident light). All PL data was normalized to the number of absorbed photons in the active layer to account for the difference in refractive index (n+ik) of capping layers using transfer matrix method and corrected for the lamp intensity during data collection.

Optical constants (n, k) and film thicknesses of organic materials were measured on silicon wafers using a variable angle spectroscope ellipsometer. Optical constants of DBP were measured on corning glass using % T measurements in combination with variable angle spectroscopic ellipsometry. UV-VIS Absorption was measured using Perkin Elmer 1050.

Example 1

DPT/RUB/DBP Cascade

FIG. 5 shows a three-layer donor cascade where the structure consisted of glass/indium-tin-oxide (ITO)/poly(3,4-ethylenedioxythiophene): poly(styrenesulfonate) (PEDOT:PSS)/diphenyltetracene (DPT, or D1)/rubrene (RUB, or D2)/tetraphenyldibenzoperiflanthene (DBP, or D3)/$C_{60}$/$C_{60}$+4,7-diphenyl-1,10-phenanthroline (BPhen)/BPhen/Ag. Thus, the first donor layer was DPT, the intermediate donor layer was RUB, and the last donor layer was DBP. DPT, RUB, and DBP have HOMO energies of about 5.4 eV and LUMO energies of about 2.9, 3.1 and 3.5 eV, respectively. Optical energy gaps for DPT, RUB, and DBP were about 2.5 eV, 2.3 eV and 1.9 eV respectively. The acceptor layer was $C_{60}$, having a HOMO energy of 6.5 eV and a LUMO energy of 4.0 eV. Accordingly, the difference between the HOMO energy of DBP and the LUMO energy of $C_{60}$ was about 1.4 eV.

Electrical parameters of this three-layer donor device are included in Table 1 below. A comparative analysis of the short circuit current density contributions calculated for each donor layer is shown in Table 2 below. The simulated EQE contributions of each active layer to the cascade efficiency were calculated using the exciton current densities The contributions of each active layer to the total $J_{sc}$ were calculated by integrating the corresponding EQE contributions over the simulated solar spectrum from λ=400 nm to 700 nm. Finally, the simulated total EQE spectrum was the sum of contributions from all active layers obtained from the best fit to the experimental EQE data.

Figure 7A:
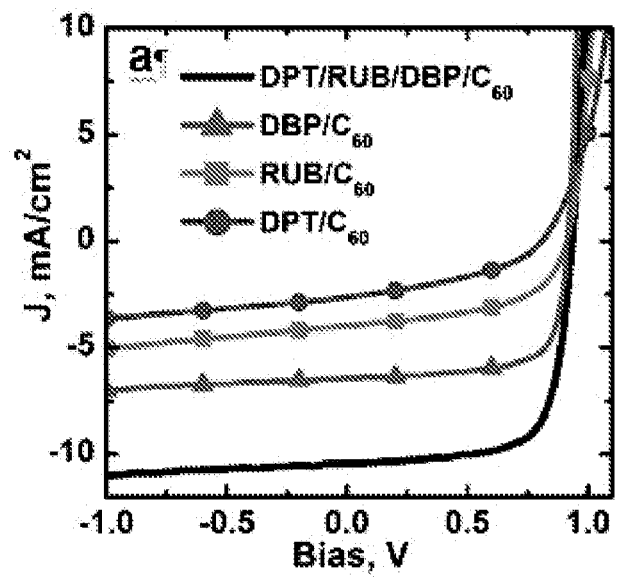
Figure 7B:
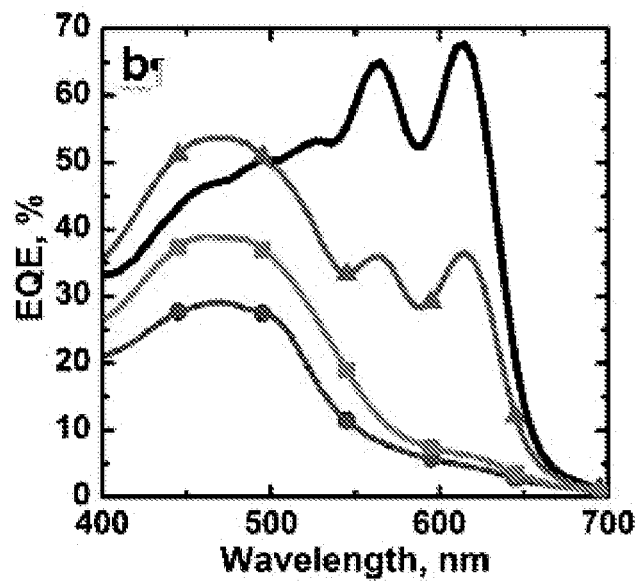
Figure 8:
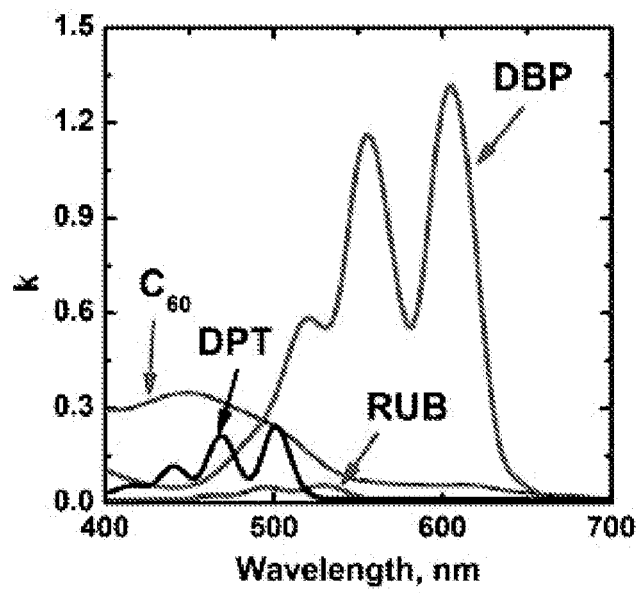
FIG. 8 shows the extinction coefficients (k) of exemplary donor and acceptor materials according to the present disclosure.

The current density vs. voltage (J-V) characteristics and external quantum efficiencies (EQE) of the DPT/RUB/DBP/$C_{60}$ cascade, and DPT/$C_{60}$, RUB/$C_{60}$, DBP/$C_{60}$ bilayer OPVs, which were constructed as controls, are shown in FIGS. 7a-b. The DPT/RUB/DBP/$C_{60}$ cascade had a PCE=7.1±0.4%, or nearly double that of the single-donor DBP/$C_{60}$ device. The improvement was primarily due to the increase in short-circuit current density from $J_{sc}$=6.7±0.3 mA/cm$^2$ to 10.6±0.5 mA/cm$^2$, with minor increases in $V_{oc}$ and fill factor (FF). All performance parameters for the devices studied are listed in Table I. The increase in $J_{sc}$ was also reflected in the increase in EQE from 37±2% to 68±3% at a wavelength of λ=615 nm, which lay only within the DBP absorption range when 10 nm thick DPT and RUB films were added (see FIG. 7b). Further, the EQE due to $C_{60}$ absorption at λ=400 nm to 550 nm was higher in the DBP/$C_{60}$ device compared to that in the cascade. The decrease in $C_{60}$ absorption in the cascade was due to the spectral overlap in absorption of $C_{60}$ with RUB and DPT, as apparent from their extinction coefficients, k (i.e. the imaginary part of complex refractive index) given in FIG. 8.

Figure 9:
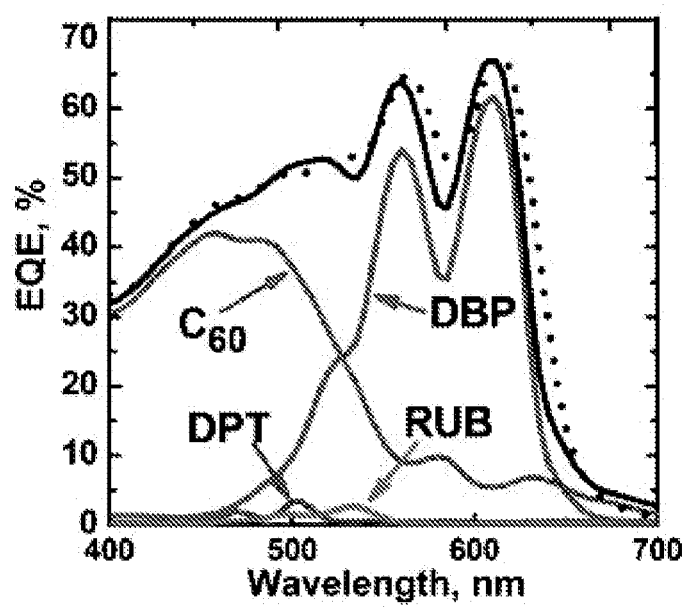
FIG. 9 shows the simulated EQE of an exemplary device according to the present disclosure.

The simulated EQE of the DPT/RUB/DBP/$C_{60}$ cascade is shown in FIG. 9. Here, DPT transferred excitons to RUB leading to the photocurrent contribution of 0.13±0.01 mA/cm$^2$, while blocking RUB excitons from reaching the anode. Further, RUB transferred excitons to DBP, contributing approximately the same photocurrent, leading to a total contribution of 0.24±0.02 mA/cm$^2$ due to exciton transfer. The DBP and $C_{60}$ layers contributed the most to the cascade photocurrent: 3.9±0.3 mA/cm$^2$ and 3.5±0.2 mA/cm$^2$, respectively (see Table II). The overall increase in $J_{sc}$ using the DPT/RUB/DBP/$C_{60}$ cascade was 1.7±0.1 mA/cm$^2$ compared to the bilayer DBP/$C_{60}$ cell, with 14% of this increase due to DPT-to-RUB-to-DBP exciton transfer. The photocurrent contribution from DBP was almost double in the cascade compared with a DBP/$C_{60}$ bilayer due to efficient exciton blocking by DPT/RUB.

Illumination of cascades lacking a $C_{60}$ acceptor with the structures: ITO/PEDOT:PSS/DPT/RUB/BPhen/Ag and ITO/PEDOT:PSS/RUB/DBP/BPhen/Ag using simulated AM1.5G spectrum with intensity up to 1 sun indicated that the structures did not generate photocurrent. Thus, it was inferred that the DPT/RUB and RUB/DBP interfaces were not photoactive, and hence did not lead to the dissociation of excitons into free charges in the there-donor cascade device.

From these analyses, it was concluded that the EQE increase observed for the DPT/RUB/DBP/$C_{60}$ cascade compared to the DBP/$C_{60}$ bilayer cell was primarily due to blocking of DBP excitons by the DPT/RUB layer. Importantly, exciton blocking by RUB led to an additional photocurrent of 1.6±0.1 mA/cm$^2$ (from 2.0±0.1 to 3.6±0.3 mA/cm$^2$) generated in DBP along with 0.12 mA/cm$^2$ due to RUB-to-DBP energy transfer; and when both DPT and RUB were included in the three donor cascade, the DBP response increased by 1.9±0.1 mA/cm$^2$ (to 3.9±0.3 mA/cm$^2$) due to improved exciton blocking by DPT/RUB, followed by an additional 0.24±0.01 mA/cm$^2$ due to DPT-to-RUB-to-DBP energy transfer.

Example 2

DPT/RUB Cascade

FIG. 6a shows an exemplary photosensitive optoelectronic device including two donor layers and an acceptor layer. The first donor layer was DPT and the second donor layer was RUB. As described above, the optical energy gaps for DPT and RUB are 2.5 eV and 2.3 eV respectively. The acceptor layer was $C_{60}$.

Device characteristics are presented in Table 1 and the short circuit current density contributions calculated for each donor layer is shown in Table 2 below. The $J_{SC}$ of the RUB/$C_{60}$ control OPV was nearly the same as DPT/RUB/$C_{60}$ cascade. The EQE modeling revealed that the DPT contribution to the $J_{SC}$ due to energy transfer is 3.8% (0.15 mA/cm$^2$), RUB contribution is 5% (0.20 mA/cm$^2$), and $C_{60}$ contributes 91.2% (3.57 mA/cm$^2$). Thus, the photocurrent contribution to the total device photocurrent of 20 nm RUB layer is equivalent to that of DPT (10 nm)/RUB (10 nm) 2-donor stack (see Table 2).

Example 3

RUB/DBP Cascade

FIG. 6b shows another exemplary photosensitive optoelectronic device comprising a multilayer donor region, including two donor layers, and an acceptor layer. In this example the first donor layer was RUB and the second donor layer was DBP. As stated above, the optical energy gaps for RUB and DBP are 2.3 eV and 1.9 eV respectively. The acceptor layer was $C_{60}$.

Device characteristics are presented in Table 1 and the short circuit current density contributions calculated for each donor layer is shown in Table 2 below. There was an increase in $J_{SC}$ from 6.7±0.3 mA/cm$^2$ to 9.3±0.5 mA/cm$^2$ upon insertion of RUB layer to the DBP/$C_{60}$ OPV. The observed 30% $J_{SC}$ enhancement was in agreement with the EQE increase in the DBP absorption region (by ~30% at 615 nm). According to optical modeling, the EQE profile was dominated by DBP (51% of total $J_{SC}$ or 3.63 mA/cm$^2$) and $C_{60}$ (47% of total $J_{SC}$ or 3.41 mA/cm$^2$), whereas contribution from RUB due to energy transfer was only 2% of total $J_{SC}$ (or 0.12 mA/cm$^2$) (see Table 2). Interestingly, the EQE response of DBP at 615 in RUB/DBP/$C_{60}$ cascade (64%) was almost the same as in DPT/RUB/DBP/$C_{60}$ cascade (68%), meaning that blocking efficiency of RUB film was similar to that of DPT/RUB film.

Example 4

DPT/DBP Cascade

FIG. 6c shows another exemplary photosensitive optoelectronic device comprising a multilayer donor region, including two donor layers, and an acceptor layer. In this example the first donor layer was DPT and the second donor layer was DBP. As stated above, the optical energy gaps for DPT and DBP are 2.5 eV and 1.9 eV respectively. The acceptor layer was $C_{60}$.

Device characteristics are presented in Table 1 and the short circuit current density contributions calculated for each donor layer is shown in Table 2 below. There was a 30% increase in EQE at 615 nm on going from DBP/$C_{60}$ to DPT/DBP/$C_{60}$ device. This EQE increase was very similar to that of the DPT/RUB/DBP/$C_{60}$ cascade OPV, showing that the blocking efficiency of DPT layer was comparable to blocking efficiency of DPT/RUB and RUB layers. Optical modeling reveals that the EQE profile was dominated by DBP (52% of total $J_{SC}$ or 3.55 mA/cm$^2$) and $C_{60}$ (44% of total $J^{SC}$ or 2.98 mA/cm$^2$), whereas contribution from DPT due to energy transfer was 4% of total $J_{SC}$ (or 0.27 mA/cm$^2$).

TABLE 1

Electrical parameters of the device cascades and control devices

| donor | $V_{OC}$, V | $J_{SC}$, mA/cm$^2$ | FF, % | PCE, % |
|---|---|---|---|---|
| DPT/RUB/DBP/$C_{60}$ | 0.94 ± 0.01 | 10.6 ± 0.5 | 71 ± 1 | 7.1 ± 0.4 |
| RUB/DBP/$C_{60}$ | 0.94 ± 0.01 | 9.3 ± 0.5 | 68 ± 1 | 6.0 ± 0.3 |
| DPT/DBP/$C_{60}$ | 0.90 ± 0.01 | 9.0 ± 0.5 | 66 ± 1 | 5.6 ± 0.3 |
| DPT/RUB/$C_{60}$ | 0.90 ± 0.01 | 3.9 ± 0.2 | 52 ± 1 | 1.9 ± 0.1 |
| RUB/$C_{60}$ | 0.89 ± 0.03 | 3.8 ± 0.2 | 47 ± 5 | 1.6 ± 0.1 |
| DPT/$C_{60}$ | 0.80 ± 0.01 | 2.7 ± 0.1 | 39 ± 1 | 0.8 ± 0.1 |
| DBP/$C_{60}$ | 0.92 ± 0.01 | 6.7 ± 0.3 | 69 ± 2 | 4.3 ± 0.2 |

TABLE 2

Modeled short circuit density ($J_{SC}$) contribution of each donor layer

| donor | $J_{SC}$ (DPT) | $J_{SC}$ (RUB) | $J_{SC}$ (DBP) | $J_{SC}$ ($C_{60}$) | $J_{SC\ Total}$ |
|---|---|---|---|---|---|
| DPT/RUB/DBP/$C_{60}$ | 0.13 (1.8%) | 0.11 (1.5%) | 3.88 (51.0%) | 3.48 (45.7%) | 7.61 (100%) |
| RUB/DBP/$C_{60}$ | — | 0.12 (1.7%) | 3.63 (50.7%) | 3.41 (47.6%) | 7.16 (100%) |
| DPT/DBP/$C_{60}$ | 0.27 (4.0%) | — | 3.55 (52.2%) | 2.98 (43.8%) | 6.80 (100%) |
| DPT/RUB/$C_{60}$ | 0.15 (3.8%) | 0.20 (5.0%) | — | 3.57 (91.2%) | 3.92 (100%) |
| RUB/$C_{60}$ | — | 0.20 (6.1%) | — | 3.14 (93.9%) | 3.34 (100%) |
| DPT/$C_{60}$ | 0.21 (8.4%) | — | — | 2.28 (91.6%) | 2.49 (100%) |
| DBP/$C_{60}$ | — | — | 2.01 (33.9%) | 3.92 (66.1%) | 5.93 (100%) |

Although particular donor materials such as DPT, RUB, and DBP are mentioned, such mention is only exemplary and it is contemplated that any combination of suitable donor layers may be selected according to the selection criteria mentioned above. It is further noted that HOMO, LUMO, and optical gap energies mentioned above relate to the mentioned exemplary donor materials and are not intended to limit or exclude the use of donor materials having different energy levels.

What is claimed is:

1. An organic photosensitive optoelectronic device comprising:
    two electrodes in superposed relation;
    an organic photoactive region between the two electrodes, wherein the organic photoactive region comprises a first donor layer adjacent to a second donor layer, and an acceptor region adjacent to the second donor layer, wherein the first and second donor layers are chosen to satisfy the following criteria:
        the first donor layer has a larger optical energy gap than the second donor layer,
        the first and second donor layers have substantially matching highest occupied molecular orbital (HOMO) energies, and
        an energy offset between lowest unoccupied molecular orbital (LUMO) energies of the first and second donor layers is less than or equal to 0.5 eV;
    wherein the second donor layer comprises tetraphenyldibenzoperiflanthene (DBP); and
    wherein the device is a photovoltaic device.

2. The organic photosensitive optoelectronic device of claim 1, wherein the device has a power conversion efficiency of at least 5.5%.

3. The organic photosensitive optoelectronic device of claim 1, wherein the first donor layer comprises rubrene (RUB).

4. The organic photosensitive optoelectronic device of claim 1, wherein the acceptor region comprises a fullerene or derivative thereof.

5. The organic photosensitive optoelectronic device of claim 4, wherein the fullerene is selected from $C_{60}$ and $C_{70}$.

6. The organic photosensitive optoelectronic device of claim 1, wherein the organic photoactive region includes a mixed photoactive layer comprising the same donor material as the second donor layer and an acceptor material.

7. The organic photosensitive optoelectronic device of claim 1, wherein the organic photoactive region includes a mixed photoactive layer comprising a donor material not included in the first or second donor layer and an acceptor material.

8. An organic photosensitive optoelectronic device comprising:
   two electrodes in superposed relation;
   an organic photoactive region between the two electrodes, wherein the organic photoactive region comprises a donor region interfacing with an acceptor region, the donor region comprising at least three donor layers, wherein the at least three donor layers comprise a first donor layer positioned furthest from the acceptor region, and a last donor layer positioned nearest to the acceptor region, and wherein the at least three donor layers are chosen to satisfy the following criteria:
      each of the at least three donor layers has an optical gap such that the optical energy gaps monotonically decrease from the optical energy gap of the first donor layer to the optical energy gap of the last donor layer,
      the at least three donor layers have substantially matching highest occupied molecular orbital (HOMO) energies, and
      each energy offset between lowest unoccupied molecular orbital (LUMO) energies of adjacent donor layers is less than or equal to 0.5 eV;
   wherein the last donor layer comprises tetraphenyldibenzoperiflanthene (DBP); and
   wherein the device is a photovoltaic device.

9. The organic photosensitive optoelectronic device of claim 8, wherein the device has a power conversion efficiency of at least 7%.

10. The organic photosensitive optoelectronic device of claim 8, wherein the first donor layer comprises diphenyltetracene (DPT) and a donor layer between the first and last donor layers comprises rubrene (RUB).

11. The organic photosensitive optoelectronic device of claim 8, wherein the acceptor region comprises a fullerene or derivative thereof.

12. The organic photosensitive optoelectronic device of claim 11, wherein the fullerene is chosen from $C_{60}$ and $C_{70}$.

13. The organic photosensitive optoelectronic device of claim 8, wherein the organic photoactive region comprises a mixed photoactive layer comprising the same donor material as the last donor layer and an acceptor material.

14. The organic photosensitive optoelectronic device of claim 8, wherein the organic photoactive region comprises a mixed photoactive layer comprising a donor material not included in a previous donor layer and an acceptor material.

15. A method of fabricating an organic photosensitive optoelectronic device, comprising:
   depositing a photoactive region over a first electrode, and depositing a second electrode over the photoactive region,
   wherein the photoactive region comprises a donor region interfacing with an acceptor region, the donor region comprises two or more donor layers, and the two or more donor layers comprise a first donor layer positioned furthest from the acceptor region and a last donor layer positioned nearest the acceptor region, and wherein the two or more donor layers are chosen to satisfy the following criteria:
      each of the two or more donor layers has an optical energy gap such that the optical energy gaps monotonically decrease from the optical energy gap of the first donor layer to the optical energy gap of the last donor layer,
      the two or more donor layers have substantially matching highest occupied molecular orbital (HOMO) energy levels, and
      each energy offset between lowest unoccupied molecular orbital (LUMO) energies of adjacent donor layers is less than or equal to 0.5 eV;
   wherein the last donor material comprises tetraphenyldibenzoperiflanthene (DBP); and
   wherein the device is a photovoltaic device.

16. The method of claim 15, wherein the photoactive region includes a mixed photoactive layer comprising a donor material and an acceptor material.

* * * * *